US009995774B2

(12) United States Patent
Mandic et al.

(10) Patent No.: US 9,995,774 B2
(45) Date of Patent: Jun. 12, 2018

(54) FREQUENCY ESTIMATION

(71) Applicant: Imperial Innovations Limited, London (GB)

(72) Inventors: Danilo Mandic, London (GB); Yili Xia, London (GB); Dahir Dini, London (GB)

(73) Assignee: IMPERIAL INNOVATIONS LIMITED, London (GB)

( * ) Notice: Subject to any disclaimer, the term of this patent is extended or adjusted under 35 U.S.C. 154(b) by 449 days.

(21) Appl. No.: 14/433,613

(22) PCT Filed: Oct. 3, 2013

(86) PCT No.: PCT/EP2013/070654
§ 371 (c)(1),
(2) Date: Apr. 3, 2015

(87) PCT Pub. No.: WO2014/053610
PCT Pub. Date: Apr. 10, 2014

(65) Prior Publication Data
US 2015/0276831 A1 Oct. 1, 2015

(30) Foreign Application Priority Data
Oct. 3, 2012 (GB) .................................. 1217737.4

(51) Int. Cl.
*G01R 19/25* (2006.01)
*G01R 23/02* (2006.01)
(Continued)

(52) U.S. Cl.
CPC ............. *G01R 23/02* (2013.01); *G01R 19/00* (2013.01); *G01R 19/2513* (2013.01); *G01R 23/04* (2013.01)

(58) Field of Classification Search
CPC .... G01R 19/2513; G01R 23/02; G01R 19/00; G01R 23/04
See application file for complete search history.

(56) References Cited

U.S. PATENT DOCUMENTS 7,498,821 B2 * 3/2009 Wells ..................... G01R 23/04
324/520
2012/0300661 A1 * 11/2012 Asplund ................... H04L 1/20
370/252

FOREIGN PATENT DOCUMENTS

WO    WO/2003/090327    10/2003

OTHER PUBLICATIONS

International Search Report in International Patent Application No. PCT/EP2013/070654, filed Oct. 3, 2013, dated Feb. 12, 2014.
(Continued)

*Primary Examiner* — Bryan Bui
(74) *Attorney, Agent, or Firm* — Bryne Poh LLP

(57) ABSTRACT

Determining a property of an electrical signal at a node instant at the current instant (INSTC); determining a previous function indicative of a property of the signal at the node at a previous instant; determining an error function in a previous frequency estimation at the node at a previous instant; determining a first current function indicative of the property of the signal at the node at INSTC in accordance with the determined property, the previous function, and the error function; receiving, from another node, a second current function indicative of a property of an electrical signal at the at least one other node at INSTC; combining the first current function and the second current function to produce a current combined function (CCF) indicative of a property of the signal at the node at INSTC; and estimating a current frequency of the signal at the node in accordance with the CCF.

20 Claims, 3 Drawing Sheets

(51) Int. Cl.
  *G01R 23/04*  (2006.01)
  *G01R 19/00*  (2006.01)

(56) References Cited

OTHER PUBLICATIONS

Pradhan et al., "Power System Frequency Estimation Using Least Mean Square Technique", In IEEE Transactions on Power Delivery, vol. 20, No. 3, Jul. 2005, pp. 1812-1816.

Rawat, T.K. and Parthasarathy, H., "A continuous-time mean-phase adaptive filter for power system frequency estimation", In International Journal of Electrical Power & Energy Systems, vol. 31, No. 2, Feb. 2009, pp. 111-115.

Written Opinion in International Patent Application No. PCT/EP2013/070654, filed Oct. 3, 2013, dated Feb. 12, 2014.

Xia et al., "A Regularised Normalised Augmented Complex Least Mean Square Algorithm", In Proceedings of the 7th International Symposium on Wireless Communication Systems, York, United Kingdom, Sep. 19-22, 2010, pp. 355-359.

Xia et al., "Adaptive Frequency Estimation in Smart Grid Applications", In IEEE Signal Processing Magazine, vol. 29, No. 5, Sep. 2012, pp. 44-54.

Xia, Y. and Mandic, D.P., "Widely Linear Adaptive Frequency Estimation of Unbalanced Three-Phase Power Systems", In IEEE Transactions on Instrumentations and Measurements, vol. 6, No. 1, Jan. 2012, pp. 74-83.

\* cited by examiner

FREQUENCY ESTIMATION

FIELD OF INVENTION

The present disclosure relates to a method and apparatus for frequency estimation. More specifically, but not exclusively, the present disclosure relates to a method and apparatus for estimating frequency in a three-phase power system.

BACKGROUND TO THE INVENTION

Electricity networks are undergoing wholesale changes both from the generation and the user (load) sides. Major challenges in this direction are envisaged to be the management of largely dynamic load levels, due to e.g., charging a large number of plugin electric vehicles (PEVs), and the duality between loads and supplies, for instance, when PEVs are used in the "vehicle to grid" mode to mitigate power shortage and system imbalances. Generation, historically aggregated into large power plants and far from the user, is gradually moving towards being located at the distribution level and based on renewable sources, that is, intrinsically intermittent. This will require enhanced flexibility of the grid and the ability to accommodate islanding and microgrids.

The idea behind smart distributed grids and microgrids is to balance as much as possible locally between production and consumption. However, the deployment of intermittent renewable sources will inevitably lead to frequent imbalance between supply and demand, as exemplified by the difficulties in maintaining system balance due to wind power variability. Signal processing is certain to play a significant role in dealing with the complexity and uncertainty associated with the smart grid and in accurate real-time estimation of the system parameters, in both balanced and unbalanced conditions.

Unexpected frequency variations from the nominal value can trigger abnormal power system conditions that can propagate and aggregate within the power grid system. Some of the major abnormal power system conditions are discussed below:

- Imbalance in the generation (G) and load (L). In the smart grid, the system will frequently switch between the main grid (MG) and microgrids (mG), with parts of the system completely switching off the MG for prolonged periods of time (islanding). The system frequency rises for G>L and decreases for G<L.
- Single- and dual-phase faults. The system frequency is derived from the relationship between the three-phase voltages. Faults in one or two phases and voltage sags (sudden drop in voltage for a short period of time) will cause an incorrect frequency estimate and alarm spread through the system, although the actual system frequency was correct.
- Dual character of load-supply. The smart grid employs dynamic loads and dual load-generator devices, such as PEVs, which can give the energy back to the grid in the case of emergency. Frequent switching will cause problems with reactive power, whose drifting causes oscillations of power levels and harmonics in frequency.
- Harmonics. Some loads (power supplies, motors, heating elements) have nonlinear voltage to current characteristics and introduce harmonics, which may be slowly floating and not integer multiplies of system frequency. They may cause resonance in the system leading to significant increase in currents and overheating of transformers. Switching on the shunt capacitors for reactive power compensation also causes strong transients and harmonics that are damaging to some equipment.
- Transient stability issues. Faults and short circuits could trigger instability, and actions such as shedding loads (or generators) that are needed to mitigate the problem require accurate frequency estimation.

Accurate and fast frequency tracking is therefore a prerequisite to enable the system to respond quickly to such problems. Approaches to frequency estimation from a single phase in three-phase power networks result in non-unique solutions. Consequently, robust frequency estimators should consider all of the three-phase voltages. However, the processing required to determine the frequency from each of the three signals in a three-phase system is computationally expensive. Consequently, various processing algorithms have been proposed in order to attempt to reduce this computational complexity.

One such means for reducing computational complexity is the Clarke's $\alpha\beta$ transform which produces a complex-valued signal from the three-phase voltages, where system frequency is obtained from the phase of this signal. Complex domain solutions for frequency tracking include phase-locked loops (PLLs), least squares, and demodulation methods. Recently, adaptive tracking algorithms based on the minimization of mean square error (MSE) have become a standard, as they are naturally suited to deal with noise, harmonics, and non-stationary environments. However, unbalanced events make it difficult to calculate phase angle, as in this case the complex-valued signal obtained from an unbalanced three-phase voltage source is represented as an orthogonal sum of positive (reflecting the energy transfer between generators and consumers) and negative (indicating imbalance between three-phase voltages) sequences. Standard complex linear adaptive filters can only cater for the positive sequences, whereas the negative sequences introduce a modelling error that oscillates at twice the system frequency. Hence, current systems for frequency tracking in three-phase systems are nowhere near optimal.

SUMMARY OF INVENTION

Embodiments of the present invention attempt to mitigate at least some of the above-mentioned problems.

According to an aspect of the invention a method is provided for estimating a frequency of an electrical signal at a node in an electrical system having a plurality of nodes. The method comprises determining, at a node of an electrical system having a plurality of nodes, at least one property of an electrical signal at the node at a current instant in time. In addition, the method comprises determining a previous function indicative of one or more properties of the electrical signal at the node at a previous instant in time. The method also comprises determining a function of an error in a previous frequency estimation at the node at a previous instant in time. Furthermore, the method comprises determining a current function indicative of the one or more properties of the electrical signal at the node at the current instant in time in accordance with the at least one determined property of the electrical signal at the node at the current instant in time, the previous function indicative of the one or more properties of the electrical signal at the node at a previous instant in time, and the function of the error in the previous frequency estimation. The method also comprises receiving, from at least one other node of the plurality of nodes, a current function indicative of one or more properties of an electrical signal at the at least one other node at the current instant in time. Then, the method comprises combining the current function indicative of one or more properties of the electrical signal at the node and the current function indicative of one or more properties of the electrical signal at the at least one other node to produce a current combined function indicative of one or more properties of the electrical signal at the node at the current instant in time. Furthermore, the method comprises estimating a current frequency of the electrical signal at the node in accordance with the current combined function.

The one or more properties of the electrical signal that the previous and current functions are indicative of may include a frequency of the electrical signal. Also, the one or more properties of the electrical signal that the previous and current functions are indicative of may include a phase associated with the electrical signal.

The determined property of the electrical signal at the node at the current instant in time may be determined by measuring the property of the electrical signal at the node. Alternatively, the may be determined by estimating the property of the electrical signal.

The determined property of the electrical signal may be a voltage. Furthermore, the determined property of the electrical signal may be a phase associated with the electrical signal. The electrical signal may be a three-phase electrical signal.

The method may further comprise converting the three-phase electrical signal into a transform-domain. The current function indicative of one or more properties of the electrical signal at the node at the current instant in time may be determined in accordance with the electrical signal in the transform-domain.

The function of an error in the previous estimated frequency may be determined by multiplication of a calculated error in a previous estimated frequency by a weighting. The weighting may be indicative of a level of confidence in the calculated error. Furthermore, the function of an error may be a function of a phase-only error.

The combining may be a linear combination process in the original or a transform domain.

The method may further comprise applying a node weighting factor to the received current function after receiving the current function indicative of one or more properties of the electrical signal at the at least one other node and before performing the step of combining. The node weighting factor may be indicative of a confidence in the accuracy of the received current function.

The current estimated frequency $\hat{f}_i(k)$ at the node i, may be determined by:

$$\hat{f}_i(k) = \frac{1}{2\pi\Delta T}\sin^{-1}(funct(k))$$

wherein $\Delta T$ is a sampling interval, and $funct(k)$ is the current combined function at the current instant in time, k.

The previous function indicative of one or more properties of the electrical signal at the node at a previous instant in time, the current function indicative of one or more properties of the electrical signal at the node at the current instant in time, and the function received from the at least one other node indicative of one or more properties of the electrical signal at the at least one other node at the current instant in time, each may comprise a first function and a second function, wherein the first function utilises the at least one determined property of the electrical signal, and the second function utilises the complex conjugate of the at least one determined property of the signal. Furthermore, the step of combining may comprise combining, at the node, the first function associated with the node with the first function associated with the at least one other node to produce a current combined first function. The step of combining may also comprise combining, at the node, the second function associated with the node with the second function associated with the at least one other node to produce a current combined second function. Furthermore, the step of estimating may comprise estimating a current frequency of the at least one electrical characteristic at the node in accordance with the current combined first function and the current combined second function.

The first function and the second function may also utilise a function of a calculated error. Furthermore, the first function and the second function may also utilise a function of the conjugate of a complex transform of the at least one determined property of the electrical signal at the node at the previous instant in time.

The first function, h, at the current instant in time, k, may be determined by:

$$h(k)=h(k-m)+\mu p(e(k-m))q(v^*(k-m))$$

wherein m can take any integer value, h(k–m) is a previous first function, p(e(k–m)) is a function of a calculated error, $\mu$ is a weighting factor applied to the calculated error, and q(v*(k–m)) is a function of the conjugate of a complex transform of the at least one determined property of the electrical signal at the node at the previous instant in time.

The second function, g, at the current instant in time, k, may be determined by:

$$g(k)=g(k-m)+\mu p(e(k-m))q(v(k-m))$$

wherein m can take any integer value, g(k–m) is a previous second function, p(e(k–m)) is a function of the calculated error, $\mu$ is a weighting factor applied to the calculated error at the previous instant in time, and q(v(k–m)) is a function of a complex transform of the at least one determined property of the electrical signal at the node at a previous instant in time.

The function of the calculated error and the function of a complex transform of the at least one determined property of the electrical signal at the node, may be determined in accordance with one or the following algorithms:

$$NCLMS\ algorithm\ p(e(k)) = e(k), q(v(k)) = \frac{v(k)}{|v(k)|^2}, or$$

$$AP\ algorithm\ p(e(k)) = e(k),$$

$$q(V(k)) = V(k)(V^T(k)V^*(k) + \delta I)^{-1}, or$$

$$LMP\ algorithm\ p(e(k)) = \angle v(k+1) - \angle \hat{v}(k+1),$$

$$q(v(k)) = \frac{jv(k)}{\hat{v}^*(k+1)}$$

Where $\hat{v}(k+1)$ is the at least one property of an electrical signal determined by estimation, e(k) is the function of an error in the frequency estimation where defined as e(k)=v(k+1)–$\hat{v}$(k+1), V(k) is the input matrix, defined as:

$$V(k) = \begin{bmatrix} v(k), v(k-1), \ldots, v(k-m) \\ v(k-1), v(k-2), \ldots, v(k-m-1) \\ \vdots \\ v(k-n), v(k-n-1), \ldots, v(k-m-n) \end{bmatrix}$$

δ is a regularisation term, I is an identity matrix, ∠ is an angle of a complex variable, and p(•) and q(•) are functions.

The step of producing the current combined first function may be defined by:

$$\underline{h}_i(k) = \sum_{l \in N_i} c(i,l) h_l(k)$$

wherein $h_i(k)$ is a current first function associated with a node of the plurality of nodes and $c(i,l)$ is a first node weighting factor indicative of a confidence in the accuracy of a current first function associated with the respective node.

The step of producing the current combined second function may be defined by:

$$\underline{g}_i(k) = \sum_{l \in N_i} c(i,l) g_l(k)$$

Wherein $g_i(k)$ is a current second function associated with a node of the plurality of nodes and $c(i,l)$ is a second node weighting factor indicative of a confidence in the accuracy of the current second function associated with the respective node.

The current estimated frequency $\hat{f}_i(k)$ at the node may be determined by:

$$f_i(k) = \frac{1}{2\pi \Delta T} \sin^{-1}\left( \text{Im}\{\underline{h}_i(k) + \underline{a}_i(k) \underline{g}_i(k)\} \right)$$

wherein ΔT is a sampling interval, Im{.} is the imaginary part operator, $\underline{h}_i(k)$ is a current combined first function, $\underline{g}_i(k)$ is a current combined second function, and $$\underline{a}_i(k) = \frac{-j\text{Im}\{\underline{h}_i(k)\} + j\sqrt{\text{Im}^2\{\underline{h}_i(k)\} - |\underline{g}_i(k)|^2}}{\underline{g}_i(k)}.$$

The current function indicative of the one or more properties of the electrical signal at the node may also be determined in accordance with a conjugate of the at least one determined property of the electrical signal.

The current function indicative of the one or more properties of the electrical signal at the node at the current instant in time may be determined in accordance with one of the following state space models:

State Space Model 1
State equation:

$$\begin{bmatrix} h_i(k) \\ g_i(k) \\ h_i^*(k) \\ g_i^*(k) \end{bmatrix} = \begin{bmatrix} h_i(k-m) \\ g_i(k-m) \\ h_i^*(k-m) \\ g_i^*(k-m) \end{bmatrix} + u_i(k)$$

Observation equation for the node, i:

$$\begin{bmatrix} v_i(k) \\ v_i^*(k) \end{bmatrix} = \begin{bmatrix} v_i(k-m)h_i(k) + v_i^*(k-m)g_i(k) \\ v_i^*(k-m)h_i^*(k) + v_i(k-m)g_i^*(k) \end{bmatrix} + n_i(k)$$

State Space Model 2
State equation:

$$\begin{bmatrix} h_i(k) \\ g_i(k) \\ h_i^*(k) \\ g_i^*(k) \\ z_i(k) \\ z_i^*(k) \end{bmatrix} = \begin{bmatrix} h_i(k-m) \\ g_i(k-m) \\ z_i(k-m)h_i(k-m) + z_i^*(k-m)g_i(k-m) \\ h_i^*(k-m) \\ g_i^*(k-m) \\ z_i^*(k-m)h_i^*(k-m) + z_i(k-m)g_i^*(k-m) \end{bmatrix} + u_i(k)$$

Observation equation for a node i:

$$\begin{bmatrix} v_i(k) \\ v_i^*(k) \end{bmatrix} = \begin{bmatrix} z_i(k) \\ z_i^*(k) \end{bmatrix} + n_i(k)$$

State Space Model 3
State equation:

$$\begin{bmatrix} h_i(k) \\ g_i(k) \end{bmatrix} = \begin{bmatrix} h_i(k-m) \\ g_i(k-m) \end{bmatrix} + u_i(k)$$

Observation equation for a node i:
$$v_i(k) = v_i(k-m)h_i(k) + v_i^*(k-m)g_i(k) + n_i(k)$$

State Space Model 4
State equation:

$$\begin{bmatrix} h_i(k) \\ g_i(k) \\ z_i(k) \end{bmatrix} = \begin{bmatrix} h_i(k-m) \\ g_i(k-m) \\ z_i(k-m)h_i(k-m) + z_i^*(k-m)g_i(k-m) \end{bmatrix} + u_i(k)$$

Observation equation for a node i:
$$v_i(k) = z_i(k) + n_i(k)$$

Wherein $h_i(k-m)$ is the first function indicative of the one or more properties of the electrical signal at the node, i, at a previous instant in time, k−m, $g_i(k-m)$ is the second function indicative of the one or more properties of the electrical signal at the node at the previous instant in time, k−m, $z_i(k-m)$ is an estimation of the one or more properties of the electrical signal at the previous instant in time, k−m, $u_i(k)$ and $n_i(k)$ are functions indicative of an error in the previous frequency estimation, and $v_i(k-m)$ is the determined property of the electrical signal at the previous instant in time, k−m, at the node, i.

According to another aspect of the invention there is provided a method for estimating a frequency of a signal. The method comprises determining a current function indicative of one or more properties of a signal at a node at a current instant in time in accordance with: a previous function indicative of one or more properties of the signal at the node at a previous instant in time; a determined property of the signal; a conjugate of the determined property of the signal; and a function of an error in a frequency estimation at the previous instant in time; and estimating a current frequency of the signal in accordance with the determined current function.

The determined property of the signal may be determined by a measurement. Alternatively, the determined property of the signal may be determined by an estimation.

The signal may be an electrical signal. The determined property of the signal may be a voltage of the signal. The signal may be a three-phase electrical signal. The method may comprise converting the three-phase electrical signal into a transform-domain. The current function may be determined in accordance with the electrical signal in the transform-domain.

The function of an error in a frequency estimation at the previous instant in time may be determined by multiplication of a function of a calculated error in the frequency estimation at the previous instant in time by a weighting. The weighting may be indicative of a level of confidence in the calculated error.

The function of an error may be a function of a phase-only error.

Each of the previous function and the current function indicative of one or more properties of the signal at the node may be determined in accordance with a first function and a second function. The first function may utilise the at least one determined property of the signal, and the second function may utilise the complex conjugate of the at least one determined property of the signal.

The current function indicative of one or more properties of the signal at the node at the current instant in time may be determined in accordance with one of the state space equations noted above.

The method may further comprise receiving, from at least one other node connected to the node, a current function indicative of one or more properties of a signal at the at least one other node at the current instant in time. The frequency may be estimated in accordance with the received current function indicative of one or more properties of the signal at the at least one other node.

Prior to estimating the current frequency, the current function indicative of one or more properties of the signal at the node and the current function indicative of one or more properties of the signal at the at least one other node may be combined in accordance with a weighting, wherein the weighting is indicative of a level of confidence in a quality of the frequency estimation at the respective node.

The current estimated frequency $f_i(k)$ at the node i, may be determined by:

$$\hat{f}_i(k) = \frac{1}{2\pi \Delta T} \sin^{-1}(F(k))$$

wherein $\Delta T$ is a sampling interval, and $F(k)$ is the current function indicative of one or more properties of the signal at the node at a current instant in time.

According to another aspect of the invention an apparatus is provided for estimating a frequency. The apparatus comprises a processing unit arranged to perform any of the various methods described herein.

According to yet another aspect of the invention a system is provided that comprises a plurality of nodes, each node being arranged in accordance with the above-mentioned apparatus. Each node of the plurality of nodes may be coupled to at least one other node of the plurality of nodes.

According to a further aspect of the invention a computer readable medium is provided comprising computer readable code operable, in use, to instruct a computer to perform any of the various methods described herein.

According to another aspect of the invention a method for estimation of frequency of an electrical signal at a node in an electrical system having a plurality of nodes is provided. The method comprises determining a current function indicative of the one or more properties of the electrical signal at the node at the current instant in time in accordance with at least one determined property of the electrical signal at the node at the current instant in time, a previous function indicative of the one or more properties of the electrical signal at the node at a previous instant in time, and a function of the error in the previous frequency estimation. A current function indicative of one or more properties of an electrical signal at the at least one other node at the current instant in time is received from at least one other node of the plurality of nodes. The current function indicative of one or more properties of the electrical signal at the node and the current function indicative of one or more properties of the electrical signal at the at least one other node are then combined to produce a current combined function indicative of one or more properties of the electrical signal at the node at the current instant in time. Finally, a current frequency of the electrical signal at the node is estimated in accordance with the current combined function.

Also disclosed is a method for estimating a frequency in an electrical power system having a plurality of nodes, each node being able to measure at least one electrical characteristic associated with the respective node and share information related to the at least one measured electrical characteristic with at least one other node of the plurality of nodes. The method may comprise measuring, at a node of the plurality of nodes, at least one electrical characteristic associated with the node at a current instant in time, k. The method may also comprise determining, at the node, a previous function, $h(k-m)$, $m=1, 2, \ldots, M$, indicative of a previous frequency estimation at the node at a previous instant in time, $k-m$, where typically $m=1$. Furthermore, the method comprises determining, at the node, a second function, $g(k-m)$, indicative of a previous frequency estimation at the node at the previous instant in time, $k-m$ (typically $m=1$). The second function includes a conjugate of a property of the at least one electrical characteristic. In addition, the method may comprise determining, at the node, a function of an error in a previous frequency estimation at the node. The method may also comprise determining a current function, h, indicative of an estimated frequency of the at least one electrical characteristic associated with the node in accordance with the previous function, $h(k-m)$, indicative of a previous frequency estimate, the function of an error in a previous frequency estimation, and a complex conjugate of the at least one electrical characteristic associated with the node at the current instant in time, k. Furthermore, the method may comprise determining a second function, g, of the estimated frequency of the at least one electrical characteristic associated with the node in accordance with the previous second function, $g(k-m)$, indicative of a previous frequency estimation, the function of an error in the previous frequency estimation, and the at least one electrical characteristic associated with the node at the current instant in time, k. In addition, the method may comprise receiving, from at least one other node of the plurality of nodes, the current function indicative of an estimated frequency and the current second function of the estimated frequency associated with the at least one other node of the plurality of nodes. The method may also comprise utilising, at the node, the current function, h, indicative of an estimated frequency at the node and the current function, h, indicative of an estimated frequency received from the at least one other node to produce a current combined (synergetic or diffused) function indicative of an estimated frequency. Also, the method may comprise summing, at the node, the current second function, g, indicative of an estimated frequency at the node and the current function, g, indicative of an estimated frequency received from the at least one other node to produce a current combined (synergetic or diffused) second function, g, indicative of an estimated frequency. Furthermore, the method may comprise estimating, at each node, a current frequency of the at least one electrical characteristic in accordance with the current combined function and the current combined complex conjugate function.

Embodiments of the invention provide a fast and accurate means for estimating frequency in a three-phase power system.

Embodiments of the invention utilise information collected from a plurality of nodes in a multinode system, which improves the accuracy of the frequency estimation.

Embodiments of the invention provide a system having multiple measurement nodes, each collecting information indicative of a frequency of electrical characteristics at each respective node. Each node then utilises the measurements from neighbouring nodes in order to improve the frequency estimation accuracy. Each node may weight the information received from each node depending on the perceived quality of the measurement at that node in order to help improve the accuracy of the frequency estimation.

Embodiments of the invention relate to a multinode frequency estimation system that utilises a widely linear filter in the estimation of the frequency of an electrical characteristic at the node. The widely linear filter considers both a function of the electrical measurement containing the frequency information and the complex conjugate of this measurement.

Embodiments of the invention relate to frequency estimation based on state space modelling techniques, including Kalman and particle filtering methods.

A widely linear model may be applied to a Euler representation of the line voltage. In particular, this model may be applied according to:

$$V_k e^{j(\omega kT+\varphi)} = V_k \cos(\omega kT+\varphi) + jV_k \sin(\omega kT+\varphi)$$

for which the recursive estimation form is:

$$V_k \cos(\omega kT+\varphi) = \tfrac{1}{2}(V_{k-1}e^{j(\omega(k-1)T+\varphi)}e^{j\omega T} + V_{k-1}e^{-j(\omega(k-1)T+\varphi)}e^{-j\omega T})$$

and the corresponding state equation is:

$$\begin{bmatrix} x_k \\ h_{a,k} \\ h_{b,k} \\ h_{c,k} \\ x_k^* \\ h_{a,k}^* \\ h_{b,k}^* \\ h_{c,k}^* \end{bmatrix} = \begin{bmatrix} x_{k-1} \\ h_{a,k-1}x_{k-1} \\ h_{b,k-1}x_{k-1} \\ h_{c,k-1}x_{k-1} \\ x_{k-1}^* \\ h_{a,k-1}^*x_{k-1}^* \\ h_{b,k-1}^*x_{k-1}^* \\ h_{c,k-1}^*x_{k-1}^* \end{bmatrix} + u_{k-1}$$

and the observation equation is:

$$\begin{bmatrix} v_{a,k} \\ v_{b,k} \\ v_{c,k} \end{bmatrix} = \begin{bmatrix} 0 & 1 & 0 & 0 & 0 & 1 & 0 & 0 \\ 0 & 0 & 1 & 0 & 0 & 0 & 1 & 0 \\ 0 & 0 & 0 & 1 & 0 & 0 & 0 & 1 \end{bmatrix} \begin{bmatrix} x_k \\ h_{a,k} \\ h_{b,k} \\ h_{c,k} \\ x_k^* \\ h_{a,k}^* \\ h_{b,k}^* \\ h_{c,k}^* \end{bmatrix} + n_k$$

Where $x_k = e^{j\omega T}$, and for a balanced system:

$h_{a,k} = \tfrac{1}{2}V_{a,k}e^{j(\omega kT+\varphi)}$ $h_{b,k} = \tfrac{1}{2}V_{b,k}e^{j(\omega kT+\varphi-2\pi/3)}$ $h_{c,k} = \tfrac{1}{2}V_{c,k}e^{j(\omega kT+\varphi+2\pi/3)}$ The system frequency is the computed as:

$$\hat{f}_k = \frac{1}{2\pi T}\arcsin(\mathcal{J}(x_k))$$

A widely linear state space model may be derived using the Euler form so that the processing is purely on the three-phase voltages rather than processing the Clarke transformed voltages. In addition, the Euler system provides improved performance for impulse disturbances, such as lightning. The Euler system may be referred to as a direct widely linear state space model.

Any dynamic rotating transform may firstly be applied to the Clarke's transform system voltage. Furthermore, any dynamic rotating transform may be applied directly to the three system voltages. The dynamic rotating transform may be one the DQ transform or the Park transform. The DQ transform may be applied directly to the three phase voltages, without going through Clarke's transform.

The quantity to be estimated may be the phase Φ of a three-phase unbalanced system. The phase Φ may be added to the "frequency term" ωkT so that the argument is always (ωkT+Φ)). It may be assumed that the frequency is changing and the phase is not. However, the phase may change too, but perhaps not at the same scale. A case may therefore be made for phase estimation using the same methodology. Such an approach may be applicable for use with the DQ transformation, where the frequency term ωkT vanishes, as the system rotates at this rotational speed, and only the phase angle Φ is changing.

BRIEF DESCRIPTION OF THE DRAWINGS

Exemplary embodiments of the invention shall now be described with reference to the drawings in which.

Throughout the description and the drawings, like reference numerals refer to like parts.

SPECIFIC DESCRIPTION

Figure 1:
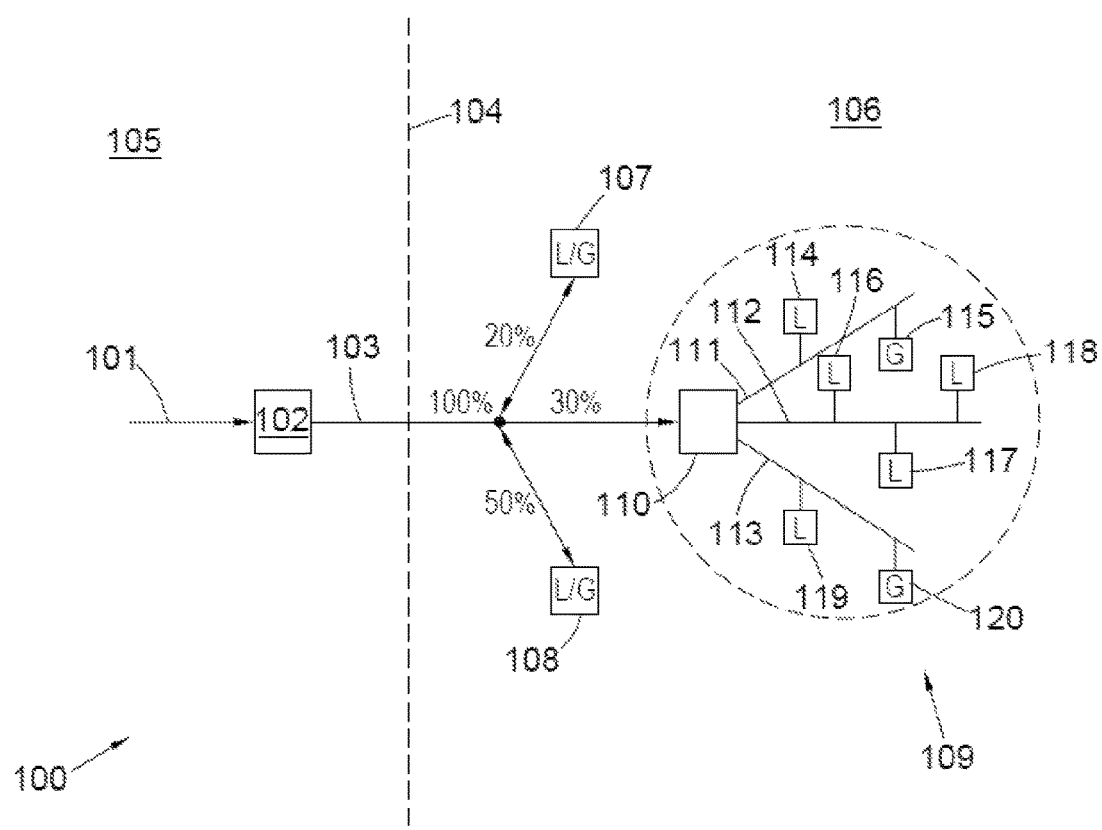
FIG. 1 is a simplified diagram of the transmissions and distribution channels of a power grid system 100.

FIG. 1 is a simplified diagram of the transmission and distribution channels of a power grid system 100.

Power is transmitted from a main power station (not shown) at a subtransmission voltage via a high voltage power line 101 and the subtransmission voltage is then received at a substation 102. The substation 102 steps the voltage down from the voltage of the high voltage power line 101 used for transmitting the power generated at the power station long distances to the substation and other substations, to a local distribution voltage delivered to an area local to the substation via a distribution voltage line 103. Dividing line 104 therefore marks a boundary between the components of the high-voltage transmission sector 105 of the system 100 and the local distribution sector 106 of the power grid system 100.

The distribution voltage line 103 splits into multiple lines delivering power to different parts of the local area. In FIG. 1, the distribution voltage line splits into three sub-lines delivering power to three separate local grids 107, 108, 109. The power delivered by the distribution voltage line 103 is unevenly split between the three local grids 107, 108, 109 by 20%, 50% and 30% respectively due to the demand of each local grid. For reasons of simplicity only one local grid 109 is depicted in detail. However, all of the local grids provide one or more loads that take power from the system and one or more generators that put power back into the system. Each load may be a particular building, such as a house, apartment block, office or factory, and each generator may be a local wind farm, household solar PV cell or any other suitable small-scale energy harvesting mechanism.

Local grid 109 comprises a local pole transformer 110 which provides a final main power voltage step down to the standard mains power to be delivered to the various end points, which in the UK is 240V AC at 50 Hz. The local grid 109 provides three local supply lines 111, 112, 113, which each connect to various loads and/or generators. In this case local supply line 111 supplies a load 114 and a generator 115, local supply line 112 supplies three loads 116, 117, 118 and local supply line 113 supplies local supply line 119, 120. Each load L will demand different amounts of power and each generator will deliver different amounts of power and the delivery of such power will be time varying due to fluctuations in power generation due to, for example in the case of solar PV cells, the variation in sunlight intensity, or for wind turbines, the variation in wind velocity.

Since the grid system of FIG. 1 has various inputs of power (i.e. generators) and outputs of power (i.e. loads) distributed throughout the system, the supply-demand power balance throughout the system will constantly be varying. The electrical signal at each node (i.e. generator/load) can be considered a separate electrical signal dependent on electrical signals at nearby nodes, or can be considered a single electrical signal that has differing characteristics at different nodes.

Due to the variations in the power balance throughout the system of FIG. 1, the system runs the risk of various problems occurring such as imbalances between the generation and load, single and dual phase faults, dual character of load-supply, harmonics, and transient stability, as previously discussed. However, the grid system 100 of FIG. 1 is specifically designed to minimise the system failures that occur within the grid system 100, as discussed below.

Each node is arranged to measure power system parameters such as voltages and/or currents and to estimate the frequency of the AC voltage at the node in accordance with those measurements. This frequency estimation can then be used to detect faults, for example by means of complex circularity analysis of the $\alpha\beta$ voltage.

The system is then further designed to improve the speed and accuracy of frequency estimation by enabling each node to share information regarding its own frequency estimation with some or all of the neighbouring nodes, or remote nodes via a communication link. Each node then utilises the information received from neighbouring nodes in its own frequency estimation, as explained in detail below with reference to FIG. 2.

Figure 2:
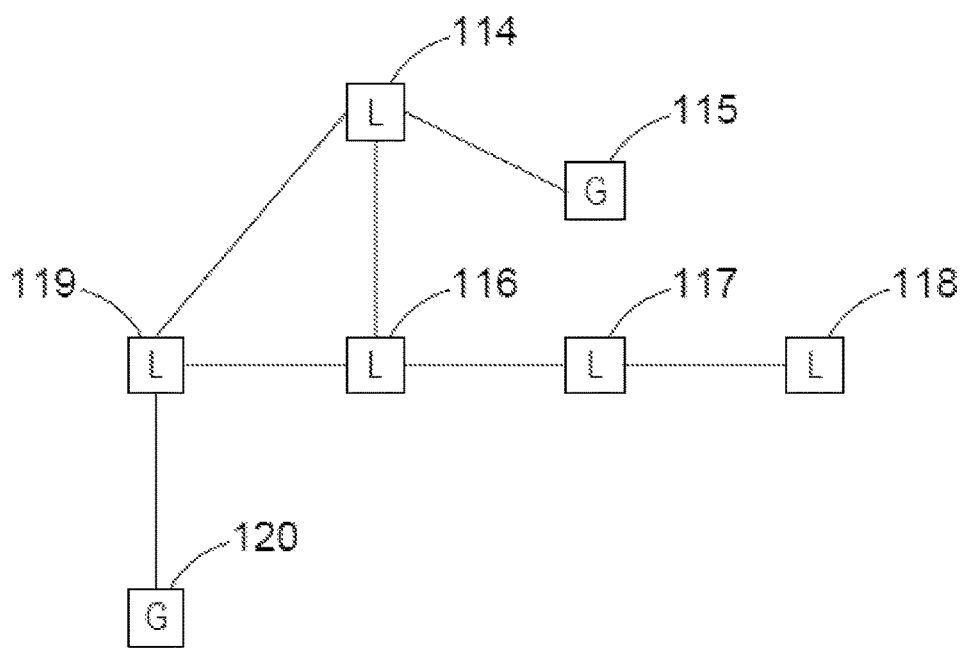
FIG. 2 is a simplified diagram of a integrated frequency determination network.

FIG. 2 is a simplified diagram of an integrated frequency estimation network. FIG. 2 relates to specifically to local grid 109 of FIG. 1. However, it will be appreciated that the network could also include other local grids, but for ease of explanation only local grid 109 is considered in this document. The integrated frequency determination network of FIG. 2 comprises a plurality of interconnected nodes, wherein each node is any position on the local grid 109 of FIG. 1 where a measurement of the electrical characteristics at that position is taken. In general, each node will correspond to the position of a load or power source within the grid, but this is not always necessary.

In general, the system of FIG. 2 works as follows. Each node is arranged to perform a frequency estimation method to determine the instantaneous frequency of the electrical signal at that node. However, in order to improve the performance and accuracy of the frequency estimation, each node shares information relating to its frequency determination with neighbouring nodes. Each node then uses the information collected directly from its own node along with information collected from neighbouring nodes regarding previous frequency estimations in order to assist in the next frequency estimation at that node. Hence, the integrated frequency determination network is a multinodal network utilising a multi-input frequency determination scheme, based on the past measurements (e.g. regression or state space approach). Such information sharing improves the accuracy and speed at which the frequency is determined and robustness against noise, harmonics, and faults in communication links.

In FIG. 2, the nodes are communicatively coupled via communications links provided via the power lines, or otherwise. For example, systems such as broadband over power lines (BPL) may be utilised. However, it will be appreciated that it is envisaged that in alternative embodiments of the invention nodes within such a network may be communicatively connected in ways other than by using BPL. For example, all nodes within a network may be wirelessly connected with one another so that all nodes share information with one another. Alternatively, all nodes may be connected to each other via a direct wired network or via a central server, which routes the information between all nodes. Hence, an internet-based connection system may be utilised.

Each node in the network receives information from different nodes. For example, in FIG. 2, node 114 receives information from nodes 119, 116 and 115, node 115 only receives information from node 114, node 119 receives information from node 114, 116, and 120, node 116 receives information from node 119, 114 and 117, node 117 receives information from node 116 and node 118, while node 118 receives information from node 117. Some nodes therefore receive information from more nodes than others. The nodes that receive more information are those nodes that are connected to a greater number of different nodes. However, the receipt of larger amounts of information should assist such nodes in identifying system errors more quickly. Furthermore, the local and distributed nature of the system means that each interconnected node is in fact passing information on to nodes that the node itself is not directly connected to. Hence, the network and in particular the passing of information through the network can be complex.

The frequency determination performed at each node shall now be described in detail.

At each node in the network a three phase voltage measurement is taken at a particular instance in time, k. Hence, at each node, three time-domain voltage measurements are obtained $v_a(k)$, $v_b(k)$ and $v_c(k)$. Each of these phase voltages can be represented mathematically in discrete time form as shown by equation 1:

$$v_a(k) = V_a(k)\cos(\omega k \Delta T + \Phi)$$
$$v_b(k) = V_b(k)\cos\left(\omega k \Delta T + \Phi - \frac{2\pi}{3}\right) \quad \text{Equation 1}$$
$$v_c(k) = V_c(k)\cos\left(\omega k \Delta T + \Phi + \frac{2\pi}{3}\right)$$

where $V_a(k)$, $V_b(k)$, and $V_c(k)$ are the voltage amplitudes of the first, second and third phase voltage signals respectively, $\omega$ is the angular frequency, k is the instant in time of the voltage measurement, $\Delta T$ is the sampling period, and $\Phi$ is the phase.

It can be seen from equation 1 that each of the three voltages of the three phase voltage signal has an associated system frequency, and their phasors rotate in the complex plane according to that frequency. However, as discussed previously, determining the system frequency from any one of the three voltages does not provide an accurate and robust measure of the overall system frequency at that node at the instance in time, k. Instead, it is necessary to determine the frequencies associated with all three voltages.

In order to simplify the process of determining the overall frequency of a voltage at a node at an instance in time, k, Clarke's transform is utilised, which employs the orthogonal $\alpha\beta 0$ transformation to map the time-dependent three-phase voltage into a zero-sequence $v_0$ and the direct- and quadrature-axis components $v_\alpha$ and $v_\beta$.

$$\begin{bmatrix} v_0(k) \\ v_\alpha(k) \\ v_\beta(k) \end{bmatrix} = \sqrt{\frac{2}{3}} \begin{bmatrix} \frac{\sqrt{2}}{2} & \frac{\sqrt{2}}{2} & \frac{\sqrt{2}}{2} \\ 1 & -\frac{1}{2} & -\frac{1}{2} \\ 0 & \frac{\sqrt{3}}{2} & -\frac{\sqrt{3}}{2} \end{bmatrix} \begin{bmatrix} v_a(k) \\ v_b(k) \\ v_c(k) \end{bmatrix} \quad \text{Equation 2}$$

For a balanced system, $V_a(k)=V_b(k)=V_c(k)$ and thus $v_0(k)=0$, $v_\alpha(k)=A\cos(\omega k \Delta T+\Phi)$, and $v_\beta(k)=A\cos(\omega k \Delta T+\Phi+\pi/2)$, where $v_\alpha(k)$ and $v_\beta(k)$ are the orthogonal coordinates of a point whose position is time variant at a rate proportional to the system frequency. In practice, only $v_\alpha$ and $v_\beta$ are used and the resulting complex voltage signal $v(k)$ is given by:

$$v(k)=v_\alpha(k)+jv_\beta(k) \quad \text{Equation 3}$$

where $j=\sqrt{-1}$.

There is no loss in information in using this representation, and this voltage also serves as the desired signal in adaptive frequency estimation and can be calculated recursively from:

$$v(k+1)=Ae^{j((k+1)\omega\Delta T+\Phi)}=v(k)e^{j\omega\Delta T} \quad \text{Equation 4}$$

Where the instantaneous system frequency f is represented by the phasor $e^{j\omega\Delta T}(f=\omega/2\pi)$.

In normal operating conditions, samples of $v(k)$ are located on a circle in the complex plane with a constant radius A. For a constant sampling frequency, the probability density function of $v(k)$ is rotation invariant since $v$ and $ve^{j\theta}$ have the same distribution for any real $\theta$. This in turn means that $v(k)$ is second order circular, and in this case, the frequency estimation can be performed adequately by a standard linear adaptive filter, based on the strictly linear model, on which techniques such as the Complex Least Mean Square (CLMS) algorithm are built, and can be summarised as:

$$\hat{v}(k+1)=v(k)w(k)$$

$$e(k)=v(k+1)-\hat{v}(k+1)$$

$$w(k+1)=w(k)+\mu p(e(k))q(v^*(k)) \quad \text{Equation 5}$$

Where $w(k)$ is the weight coefficient at time instant k, $\hat{v}(k+1)$ is the estimate of the desired signal $v(k+1)$, $e(k)$ is the estimation error, and $\mu$ is the step-size. For the CLMS, the functions above take the form $p(e(k))=e(k)$ and $q(v(k))=v(k)$.

Comparing Equation 5 and the strictly linear model in equation 4, the system frequency can be estimated from:

$$\hat{f}(k) = \frac{1}{2\pi\Delta T}\sin^{-1}(\text{Im}(w(k))) \quad \text{Equation 6}$$

where $\text{Im}(\bullet)$ is the imaginary part operator.

While frequency can be estimated from equation 6, such an equation does not produce optimal results because it only takes into consideration the second order circularity, and is thus only suitable for balanced systems, for which their Clarke's voltage would be depicted by a circle in a circularity diagram.

As such, in alternative embodiments of the invention alternative frequency estimation methods are utilised, which produce optimal or near optimal results, as discussed below.

When the three-phase power system deviates from its normal condition, such as when the three channel voltages exhibit different levels of dips or transients, or the phase difference between two channels deviates from the nominal $$\frac{2\pi}{3},$$

$v_a(k)$, $v_b(k)$ and $v_c(k)$ are not identical, and samples of $v(k)$ are not allocated on a circle with a constant radius, the distribution of $v(k)$ is rotation dependent (noncircular), and the signal is accurately expressed only by using a widely linear model, that is a model utilising both second-order circular and non-circular information (covariance and pseudocovariance), as defined by:

$$v(k) = A(k)e^{j(\omega k \Delta T+\phi)} + B(k)e^{-j(\omega k \Delta T+\phi)} \quad \text{Equation 7}$$

Where $$A(k) = \frac{\sqrt{6}(V_a(k)+V_b(k)+V_c(k))}{6} \text{ and}$$

$$B(k) = \frac{\sqrt{6}(2V_a(k)-V_b(k)-V_c(k))}{12} - j\frac{\sqrt{2}(V_b(k)-V_c(k))}{4}$$

In other words, when $V_a(k)$, $V_b(k)$ and $V_c(k)$ are not identical, B(k) is not equal to 0, introducing a certain degree of non-circularity. Since the widely linear model is a second order optimal estimator for noncircular data, both v(k) and its complex conjugate, v*(k), should be considered in the frequency estimation in unbalanced cases. In order to improve performance, the second order non-circularity (improperness) is therefore also taken into account, i.e.:

$$\hat{v}(k+1)=v(k)h(k)+v^*(k)g(k) \quad \text{Equation 8}$$

Where h(k) and g(k) are the filter weight coefficients corresponding to the standard, h, and second, g, updates at time instant k, respectively, wherein the estimation error e(k) is defined as $e(k)=v(k+1)-\hat{v}(k+1)$.

The weight update of the so-called Augmented Complex Least Mean Square (ACLMS) algorithm, designed for training the widely linear adaptive filters is given by:

$$h(k+1)=h(k)+\mu p(e(k))q(v^*(k))$$

$$g(k+1)=g(k)+\mu q(e(k))q(v(k)) \quad \text{Equation 9}$$

where $p(e(k))=e(k)$ and $q(v(k))=v(k)$.

It is noted that there are several stochastic gradient type algorithms to train the widely linear adaptive filters, such as the normalised complex least mean square (NCLMS), affine projection (AP), least mean phase (LMP), and their sign and leaky versions, depending on the choice of function used for the functions p(•) and q(•). The weight update of all the algorithms use Equation 9 and the specific functions p(•) and q(•) is summarised as:

$$\text{NCLMS algorithm } p(e(k)) = e(k), q(v(k)) = \frac{v(k)}{|v(k)|^2} \quad \text{Equation 10}$$

$$\text{AP algorithm } p(e(k)) = e(k),$$

$$q(V(k)) = V(k)(V^T(k)V^*(k) + \delta I)^{-1}$$

$$\text{LPM algorithm } p(e(k)) = \angle v(k+1) - \angle \hat{v}(k+1),$$

$$q(v(k)) = \frac{jv(k)}{\hat{v}^*(k+1)}$$

Where $\hat{v}(k+1)$ is the at least one property of an electrical signal determined by estimation, e(k) is the function of an error in the frequency estimation where defined as $e(k)=v(k+1)-\hat{v}(k+1)$, V(k) is the input matrix, defined as:

$$V(k) = \begin{bmatrix} v(k), v(k-1), \ldots, v(k-m) \\ v(k-1), v(k-2), \ldots, v(k-m-1) \\ \vdots \\ v(k-n), v(k-n-1), \ldots, v(k-m-n) \end{bmatrix}$$

δ is a regularisation term, which is kept to be a small positive constant, I is an identity matrix, ∠ is an angle of a complex variable, and p(•) and q(•) are functions.

To introduce the corresponding ACLMS-based frequency estimation method for the three-phase unbalanced power system, by substituting Equation 7 into 8, the estimate $\hat{v}(k+1)$ can be expressed as:

$$\hat{v}(k+1) = A(k)h(k)e^{j(\omega k \Delta T + \phi)} + B(k)h(k)e^{-j(\omega k \Delta T + \phi)} + \quad \text{Equation 11}$$

$$A^*(k)g(k)e^{-j(\omega k \Delta T + \phi)} + B^*(k)g(k)e^{j(\omega k \Delta T + \phi)}$$

-continued $$= (A(k)h(k) + B^*(k)g(k))e^{j(\omega k \Delta T + \phi)} +$$

$$(A^*(k)g(k) + B(k)h(k))e^{-j(\omega k \Delta T + \phi)}$$

While from Equation 7, the expression for v(k+1) can be rewritten as:

$$v(k+1)=A(k+1)e^{j\omega\Delta T}e^{j(\omega k \Delta T+\varphi)}+B(k+1)e^{-j\omega\Delta T}e^{-j(\omega k \Delta T+\varphi)} \quad \text{Equation 12}$$

Therefore, at the steady state, the first term on the right hand side (RHS) of Equation 12 can be estimated approximately by its counterpart in Equation 11; hence, the term $e^{j\omega\Delta T}$ containing the frequency information can be estimated as:

$$e^{j\omega\Delta T} = \frac{A(k)h(k) + B^*(k)g(k)}{A(k+1)} \quad \text{Equation 13}$$

Comparing the second term on the RHS of Equation 11 and 12, the evolution of the term $e^{-j\omega\Delta T}$ can be expressed as:

$$e^{-j\omega\Delta T} = \frac{A^*(k)g(k) + B(k)h(k)}{B(k+1)} \quad \text{Equation 14}$$

Upon taking the complex conjugate, we obtain:

$$e^{j\omega\Delta T} = \frac{A(k)g^*(k) + B^*(k)h^*(k)}{B^*(k+1)} \quad \text{Equation 15}$$

We here adopt the assumptions held implicitly in frequency estimation by adaptive filtering algorithms that $A(k+1) \approx A(k)$ and $B(k+1) \approx B(k)$, and thus, Equation 13 and Equation 15 can be simplified as:

$$e^{j\omega\Delta T} = h(k) + \frac{B^*(k)}{A(k)}g(k) \quad \text{Equation 16}$$

$$e^{j\omega\Delta T} = h^*(k) + \frac{A(k)}{B^*(k)}g^*(k) \quad \text{Equation 17}$$

Since the coefficient A(k) is real-valued, whereas B(k) is complex-valued, and thus, $B^*(k)/A(k)=(B(k)/A(k))^*$. Since Equation 16 should be equal to Equation 17, using $a(k)=(B(k)/A(k))^*$, we can find the form of a(k) by solving the following quadratic equation with complex-valued coefficients:

$$g(k)a^2(k)+(h(k)-h^*(k))a(k)-g^*(k)=0 \quad \text{Equation 18}$$

Where the discriminant of this quadratic equation is given by:

$$\Delta = \sqrt{(h(k) - h^*(k))^2 + 4|g(k)|^2} \quad \text{Equation 19}$$

$$= 2\sqrt{-\text{Im}^2(h(k)) + |g(k)|^2}$$

Since a(k) is complex-valued, the discriminant is negative, and the two roots can be found as:

$$a_1(k) = \frac{-j\mathcal{T}(h(k)) + j\sqrt{\text{Im}^2(h(k)) - |g(k)|^2}}{g(k)} \quad \text{Equation 20}$$

$$a_2(k) = \frac{-j\mathcal{T}(h(k)) - j\sqrt{\text{Im}^2(h(k)) - |g(k)|^2}}{g(k)}$$

From Equation 16, the phasor $e^{j\hat{\omega}\Delta T}$ is estimated either by using $h(k)+a_1(k)g(k)$ or $h(k)+a_2(k)g(k)$. Since the system frequency is far smaller than the sampling frequency, the imaginary part of $e^{j\hat{\omega}\Delta T}$ is always positive, thus excluding the solution based on $a_2(k)$. The system frequency $\hat{f}(k)$ is therefore estimated in the form:

$$\hat{f}(k) = \frac{1}{2\pi\Delta T}\sin^{-1}(\text{Im}(h(k) + a_1(k)g(k))) \quad \text{Equation 21}$$

It is noted that, in addition to equation 21, there are several functions to obtain the estimated system frequency, and our aim here is to claim any functions involving h(k−m) and g(k−m), where m can take any integer value, that can be used to calculate the frequency estimate.

The above described systems for frequency calculation relate to frequency calculation at a single node, without interaction between the nodes. The improved global frequency determination shall therefore now be discussed in detail.

Whether using the widely linear or state space models, at each node it is possible to derive the functions h and g from the previous error, complex voltage samples, sampling time interval $\Delta T$ and the phase $\Phi$. In particular, the h and g parameters of each node i are determined from Equation 9 for the widely linear model or from any one of Equations 22, 26, 28, 30 and 32 for the state space models.

$$h_i(k+1) = h_i(k) + p(e_i(k))q(v_i^*(k))$$

$$g_i(k+1) = g_i(k) + p(e_i(k))q(v_i(k)) \quad \text{Equation 22}$$

Where $h_i(k)$ and $g_i(k)$ are the h and g estimate at node i at time k, $e_i(k)$ is an error calculated using previous error estimates of the parameters h and g together with the signals observed or measured at node i, namely $v_i(k-m)$ where the value of m can be any integer, and functions p and q are as in equations 9 and 10. Different methods for estimating $h_i(k)$ and $g_i(k)$ can be achieved, such as the normalised least mean square (NLMS) and least mean phase (LMP), depending on the choice of function used for the functions $p(\bullet)$ and $q(\bullet)$. The variables $\underline{h}_i(k)$ and $\underline{g}_i(k)$ are the diffused or global h and g estimates at node i at time instant k, and are computed as:

$$\underline{h}_i(k) = \sum_{l \in N_i} c(i,l) h_l(k) \quad \text{Equation 23}$$

$$\underline{g}_i(k) = \sum_{l \in N_i} c(i,l) g_l(k)$$

Where all the h estimates received by node i, as well as the h estimate from node i itself are weighted using the node dependent weighting factors or coefficients c(i,l), while the expression $N_i$ represents the neighbourhood of node i, which consists of node i and all the other nodes that can communicate or are connected with node i. It is appreciated that the weighing factors c(i,l) used for computing the diffused variable $\underline{h}_i(k)$ can either be the same as or different from those used for $\underline{g}_i(k)$. Moreover, the diffused variables $\underline{h}_i(k)$ and $\underline{g}_i(k)$ can be alternatively computed from the h and g estimates through nonlinear mappings such that:

$$\underline{h}_i(k) = r(h_{N_i}) \quad \text{Equation 24}$$

$$\underline{g}_i(k) = s(g_{N_i}) \quad \text{Equation 25}$$

Wherein $r(\bullet)$ and $s(\bullet)$ are linear or nonlinear functions, and $h_{N_i}$ is a vector consisting of all the h estimates from the neighbourhood of node i, similarly, $g_{N_i}$ is a vector consisting of all the g estimates from the neighbourhood of node i.

In other words, when each node has determined its local h and g value it then shares this information with each of the connected nodes in the network. Each node then receives h and g values from any nodes with which the respective node is connected. Each node then determines a global $\underline{h}$ and $\underline{g}$, based on each of the local h and g values it has received and the h and g value that it has determined.

In practice, each node combines the received h values and received g values independently. A set of weighting factors, one associated with each local node, including itself, are applied to each h and g value in the summation process. The weighting factors or coefficients c(i,l) are indicative of the perceived accuracy of the information associated with each node. Hence, some nodes which provide accurate frequency estimation will be heavily weighted in the summation, while others, which do not provide accurate frequency estimation, are less heavily weighted in the summation. A weighting factor of zero could be utilised to discard information from a particular node. The node dependent weightings may be continually updated based upon error determinations.

More specifically, the weighing factors or coefficients c (or r and s) from each node i in the multi-node network can be chosen from a number of different possible schemes. These schemes include, but are not limited to:

Methods for which the weighing factors are chosen according to the distributed network topology, such as the nearest neighbourhood method, which involve setting the weighing factors according to the number of nodes each node can communicate with;

Methods involving setting weighing factors according to errors, be they functions of the estimated or calculated instantaneous errors, or predetermined errors; or Methods involving using predetermined weighing factors without any estimation or calculation.

In an alternative embodiment of the invention the variables, $h_i$ and $g_i$ are estimated using state space modelling techniques, including Kalman and particle filters. Within such frameworks, the estimation problem is described by state space models, which consists of state and observation equations, after which the actual algorithm is implemented using the state space model. The state equation describes how the variables to be estimated ($h_i$ and $g_i$) evolve with time, while the observation equation describes how the measurements ($v_i$) are related to the state variables ($h_i$ and $g_i$).

Any one of the following state space models could be utilised for the determination of the variables $h_i$ and $g_i$.

State Space Model 1:
State equation:

$$\begin{bmatrix} h_i(k) \\ g_i(k) \\ h_i^*(k) \\ g_i^*(k) \end{bmatrix} = \begin{bmatrix} h_i(k-m) \\ g_i(k-m) \\ h_i^*(k-m) \\ g_i^*(k-m) \end{bmatrix} + u_i(k) \quad \text{Equation 26}$$

Observation equation for a node i in a network:

$$\begin{bmatrix} v_i(k) \\ v_i^*(k) \end{bmatrix} = \begin{bmatrix} v_i(k-m)h_i(k) + v_i^*(k-m)g_i(k) \\ v_i^*(k-m)h_i^*(k) + v_i(k-m)g_i^*(k) \end{bmatrix} + n_i(k) \quad \text{Equation 27}$$

Where $v_i(k)$ is Clarke's αβ transformed voltage at node i at time instant k, the variables $u_i(k)$ and $n_i(k)$ are noise models with possibly varying statistics, which can be used to model inaccuracies in the system, as well as to set the convergence rates of algorithms (including Kalman filters), while the symbol $(.)^*$ is the complex conjugate operator. The time index variable m can take multiple values but is typically set to 1.

State Space Model 2:
State equation:

$$\begin{bmatrix} h_i(k) \\ g_i(k) \\ z_i(k) \\ h_i^*(k) \\ g_i^*(k) \\ z_i^*(k) \end{bmatrix} = \begin{bmatrix} h_i(k-m) \\ g_i(k-m) \\ z_i(k-m)h_i(k-m) + z_i^*(k-m)g_i(k-m) \\ h_i^*(k-m) \\ g_i^*(k-m) \\ z_i^*(k-m)h_i^*(k-m) + z_i(k-m)g_i^*(k-m) \end{bmatrix} + u_i(k) \quad \text{Equation 28}$$

Observation equation for a node i in a network:

$$\begin{bmatrix} v_i(k) \\ v_i^*(k) \end{bmatrix} = \begin{bmatrix} z_i(k) \\ z_i^*(k) \end{bmatrix} + n_i(k) \quad \text{Equation 29}$$

The state and observation noise variables, that is variables $u_i(k)$ and $n_i(k)$, in State Space Model 2 are not necessarily the same as those in State Space Model 1, due to the differing natures of the models. State Space Model 2 contains the variable $z_i(k)$, which is used to estimate Clarke's transformed voltage $v_i(k)$. Consequently, this makes State Space Model 2 more robust to systems with increased observation noise.

State Space Model 3:
State equation:

$$\begin{bmatrix} h_i(k) \\ g_i(k) \end{bmatrix} = \begin{bmatrix} h_i(k-m) \\ g_i(k-m) \end{bmatrix} + u_i(k) \quad \text{Equation 30}$$

Observation equation for a node i in a network:

$$v_i(k) = v_i(k-m)h_i(k) + v_i^*(k-m)g_i(k) + n_i(k) \quad \text{Equation 31}$$

State Space Model 3 is essentially the strictly linear version of State Space Model 1, and is more suited to cases where the state and observation noises have circular distributions.

State Space Model 4:
State equation:

$$\begin{bmatrix} h_i(k) \\ g_i(k) \\ z_i(k) \end{bmatrix} = \begin{bmatrix} h_i(k-m) \\ g_i(k-m) \\ z_i(k-m)h_i(k-m) + z_i^*(k-m)g_i(k-m) \end{bmatrix} + u_i(k) \quad \text{Equation 32}$$

Observation equation for a node i in a network:

$$v_i(k) = z_i(k) + n_i(k) \quad \text{Equation 33}$$

State Space Model 4 is the strictly linear version of State Space Model 2, and is more suited to systems with circular noise distributions.

The statistics of the noise models, $u_i(k)$ and $n_i(k)$, in the state space models above can be different for each state space models, and vary with time. These statistics do not necessarily need to conform to the true underlying statistics, and can be chosen, computed or estimated using a number of different methods. For example, the covariance matrix for $n_i(k)$ can be set to a multiple of the identity matrix (e.g. 100I), while simultaneously the covariance matrix for $u_i(k)$ is set to a zero matrix or a multiple of the identity matrix (e.g. 0.1I). In fact, the statistics used for these noise models, as well as that for the state estimate itself, can be varied according to calculated or estimated errors.

The initialisation for all the algorithms based on the state space models and gradient decent techniques described above, are such that the $h_i$ and $g_i$ variables at each node i are set using the best estimates available for these variables at each node, which can be based on the expected nominal operating frequency at each node. However, it is appreciated that the $h_i$ and $g_i$ variables can be initialised using a number of different methods, including randomly initialisation, using predetermined values or estimated (or computed) prior to starting the algorithms.

Once the global h and g functions are determined at each node, it is possible for each node to estimate the frequency of the voltage at the node. Firstly, the derivation of the frequency calculation utilised by each node will be explained.

$$f_i(k) = \frac{1}{2\pi\Delta T}\sin^{-1}\left(Im\{\underline{h}_i(k) + \underline{a}_i(k)\underline{g}_i(k)\}\right) \quad \text{Equation 34}$$

Where $\Delta T$ is the sampling period, $Im\{.\}$ is the imaginary part of a complex number, and $$\underline{a}_i(k) = \frac{-jIm\{\underline{h}_i(k)\} + j\sqrt{Im^2\{\underline{h}_i(k)\} - |\underline{g}_i(k)|^2}}{\underline{g}_i(k)}.$$

A global frequency estimator, consisting of the all the individual estimates by all the nodes in the network, can then be derived as:

$$f_{global}(k) = \frac{1}{2\pi T}\sin^{-1}\left(Im\{\underline{h}_{global}(k) + \underline{\alpha}_{global}(k)\underline{g}_{global}(k)\}\right) \quad \text{Equation 35}$$

$$\underline{\alpha}_{global}(k) = \frac{-jIm\{\underline{h}_{global}(k)\} + j\sqrt{Im^2\{\underline{h}_{global}(k)\} - |\underline{g}_{global}(k)|^2}}{\underline{g}_{global}(k)}$$

Where $\underline{h}_{global}(k) = \frac{1}{L}\sum_{i=1}^{L}\underline{h}_i(k)$ and $\underline{g}_{global}(k) = \frac{1}{L}\sum_{i=1}^{K}\underline{g}_i(k)$ It is noted that, similarly to equation 21, in equations 34 and 35 there are several functions to obtain the estimated system frequency, and our aim here is to claim any functions involving h(k−m) and g(k−m), where m can take any integer value, that can be used to calculate the frequency estimate.

It will be appreciated that the above-mentioned method for utilising resources from multiple nodes in order to provide an improved frequency estimation could equally utilise a strictly linear model, as discussed previously. When such a strictly linear model is used the weight coefficient received from each node is combined to obtain a combined function. The combined function may be determined in a similar way to the methods described above. Finally, the frequency can then be determined based on this combined function.

Figure 3:
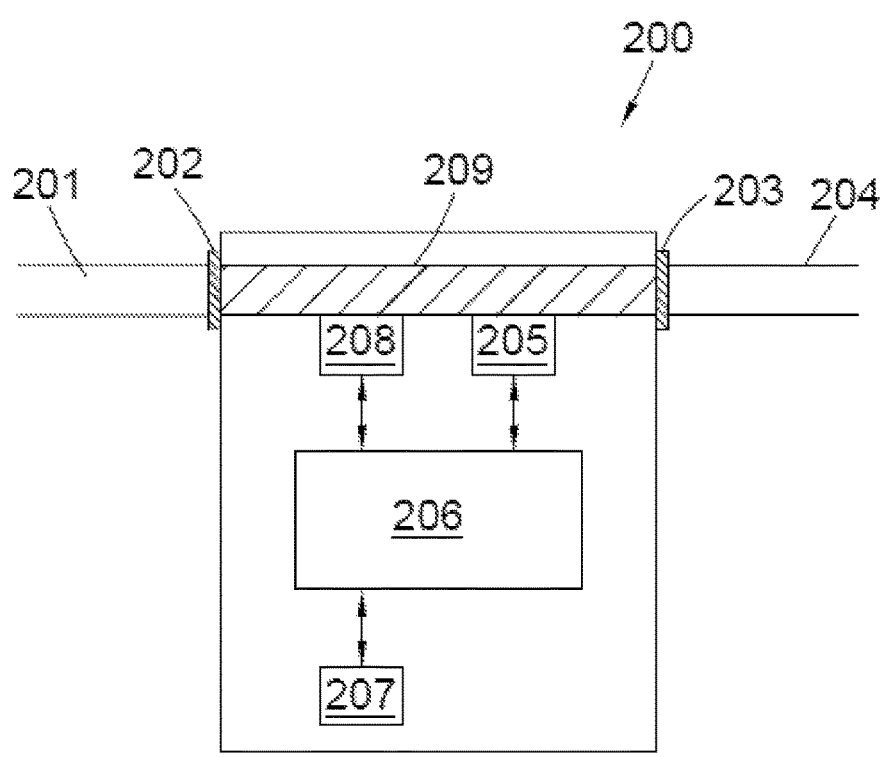
FIG. 3 shows a structure of a node.

The structure of the frequency estimation apparatus at example node 200 shall now be described with reference to FIG. 3.

Node 200 receives power from an supply power cable 201 at power input 202, and the received power is then output to the local area, which may be a building or such like, via the power output 203 and the local power distribution line 204. Sensor 205 measures a voltage at the node 200 and supplies this node to processor 206, which performs the frequency estimation. Memory 207 is provided for use during the frequency estimation process. A communication unit 208 is then coupled to the processor and to the internal power connection 209 in order to transmit frequency estimation information at node 208 to neighbouring nodes, and receive frequency estimation information from neighbouring nodes.

While the frequency estimation at node 200 has been depicted as a standalone unit, it will be appreciated that such functionality could be incorporated within a standard smart meter. Such smart meters include the processor, memory, sensor, and communication unit required by the frequency estimation apparatus. Consequently, the frequency estimation process could be incorporated in software downloaded onto a smart meter. The smart meter hardware could then implement the frequency estimation software. Hence, the various methods described above may be implemented by a computer program, as discussed below.

The computer program may include computer code arranged to instruct a computer to perform the functions of one or more of the various methods described above. A smart meter may be considered a computer in such circumstances. The computer program and/or the code for performing such methods may be provided to an apparatus, such as a computer or smart meter, on a computer readable medium. The computer readable medium could be, for example, an electronic, magnetic, optical, electromagnetic, infrared, or semiconductor system, or a propagation medium for data transmission, for example for downloading the code over the Internet. Non-limiting examples of a physical computer readable medium include semiconductor or solid state memory, magnetic tape, a removable computer diskette, a random access memory (RAM), a read-only memory (ROM), a rigid magnetic disc, and an optical disk, such as a CD-ROM, CD-R/W or DVD.

An apparatus such as a computer may be configured in accordance with such computer code to perform one or more processes in accordance with the various methods discussed above.

It will be appreciated that any of the state space models or regressions models described above may be utilised for estimating the frequency of any signal and not just an electrical signal. Furthermore, it will be appreciated that any of the state space models and regression models based on equation (10) described above can be utilised for estimating frequency at a single node without receiving and utilising information from neighbouring nodes.

The invention claimed is:

1. A method for estimating a frequency of an electrical signal at a node in an electrical system having a plurality of nodes, the method comprising:
   determining, at a node of an electrical system having a plurality of nodes, at least one property of an electrical signal at the node at a current instant in time;
   determining a previous function indicative of one or more properties of the electrical signal at the node at a previous instant in time;
   determining a function of an error in a previous frequency estimation at the node at a previous instant in time;
   determining a current function indicative of the one or more properties of the electrical signal at the node at the current instant in time in accordance with the at least one determined property of the electrical signal at the node at the current instant in time, the previous function indicative of the one or more properties of the electrical signal at the node at a previous instant in time, and the function of the error in the previous frequency estimation;
   receiving, from at least one other node of the plurality of nodes, a current function indicative of one or more properties of an electrical signal at the at least one other node at the current instant in time;
   combining the current function indicative of one or more properties of the electrical signal at the node and the current function indicative of one or more properties of the electrical signal at the at least one other node to produce a current combined function indicative of one or more properties of the electrical signal at the node at the current instant in time; and
   estimating a current frequency of the electrical signal at the node in accordance with the current combined function.

2. The method according to claim 1, wherein the one or more properties of the electrical signal that the previous and current functions are indicative of includes a frequency of the electrical signal.

3. The method according to claim 2, wherein the one or more properties of the electrical signal that the previous and current functions are indicative of includes a phase associated with the electrical signal.

4. The method according to claim 1, wherein the determined property of the electrical signal is a voltage, the method further comprising converting the three-phase electrical signal into a transform-domain, wherein the current function indicative of one or more properties of the electrical signal in the transform-domain.

5. The method according to claim 1, wherein the function of an error in the previous estimated frequency is determined by multiplication of a calculated error in a previous estimated frequency by a weighting, wherein the weighting is indicative of a level of confidence in the calculated error.

6. The method according to claim 1, wherein the function of an error is a function of a phase-only error.

7. The method according to claim 1, wherein the combining is a linear combination process in the original or a transform domain.

8. The method according to claim 1, further comprising:
   after receiving the current function indicative of one or more properties of the electrical signal at the at least one other node, applying a node weighting factor to the received current function before performing the step of combining, wherein the node weighting factor is indicative of a confidence in the accuracy of the received current function.

9. The method according to 1, wherein the current estimated frequency $\hat{f}_i(k)$ at the node i, is determined by:

$$\hat{f}_i(k) = \frac{1}{2\pi\Delta T}\sin^{-1}(funct(k))$$

wherein ΔT is a sampling interval, and funct(k) is the current combined function at the current instant in time, k.

10. The method according to claim 1, wherein the previous function indicative of one or more properties of the electrical signal at the node at a previous instant in time, the current function indicative of one or more properties of the electrical signal at the node at the current instant in time, and the function received from the at least one other node indicative of one or more properties of the electrical signal at the at least one other node at the current instant in time, each comprise:
a first function and a second function, wherein the first function utilizes the at least one determined property of the electrical signal, and the second function utilizes the complex conjugate of the at least one determined property of the signal; and
the step of combining comprises:
combining, at the node, the first function associated with the node with the first function associated with the at least one other node to produce a current combined first function; and
combining, at the node, the second function associated with the node with the second function associated with the at least one other node to produce a current combined second function; and
the step of estimating comprises estimating a current frequency of the at least one electrical characteristic at the node in accordance with the current combined first function and the current combined second function.

11. The method according to claim 10, wherein the first function and the second function also utilize a function of a calculated error.

12. The method according to claim 10, wherein the first function and the second function also utilize a function of the conjugate of a complex transform of the at least one determined property of the electrical signal at the node at the previous instant in time.

13. The method according to claim 10, wherein the first function, h, at the current instant in time, k, is determined by:

$$h(k)=h(k-m)+\mu p(e(k-m))q(v^*(k-m))$$

wherein m can take any integer value, h(k−m) is a previous first function, p(e(k−m)) is a function of a calculated error, μ is a weighting factor applied to the calculated error, and q(v*(k−m)) is a function of the conjugate of a complex transform of the at least one determined property of the electrical signal at the node at the previous instant in time.

14. The method according to claim 10, wherein the second function, g, at the current instant in time, k, is determined by:

$$g(k)=g(k-m)+\mu p(e(k-m))q(v(k-m))$$

wherein m can take any integer value, g(k−m) is a previous second function, p(e(k−m)) is a function of the calculated error, μ is a weighting factor applied to the calculated error at the previous instant in time, and q(v(k−m)) is a function of a complex transform of the at least one determined property of the electrical signal at the node at a previous instant in time.

15. The method according to claim 10, wherein the current function indicative of the one or more properties of the electrical signal at the node at the current instant in time is determined in accordance with the following state space model:

State equation:

$$\begin{bmatrix} h_i(k) \\ g_i(k) \\ h_i^*(k) \\ g_i^*(k) \end{bmatrix} = \begin{bmatrix} h_i(k-m) \\ g_i(k-m) \\ h_i^*(k-m) \\ g_i^*(k-m) \end{bmatrix} + u_i(k)$$

Observation equation for the node, i:

$$\begin{bmatrix} v_i(k) \\ v_i^*(k) \end{bmatrix} = \begin{bmatrix} v_i(k-m)h_i(k) + v_i^*(k-m)g_i(k) \\ v_i^*(k-m)h_i^*(k) + v_i(k-m)g_i^*(k) \end{bmatrix} + n_i(k)$$

Wherein $h_i(k-m)$ is the first function indicative of the one or more properties of the electrical signal at the node, i, at a previous instant in time, k−m, $g_i(k-m)$ is the second function indicative of the one or more properties of the electrical signal at the node at the previous instant in time, k−m, $u_i(k)$ and $n_i(k)$ are functions indicative of an error in the previous frequency estimation, and $v_i(k-m)$ is the determined property of the electrical signal at the previous instant in time, k−m, at the node, i.

16. The method according to claim 10, wherein the current function indicative of the one or more properties of the electrical signal at the node, i, at the current instant in time is determined in accordance with the following state space model:

$$\begin{bmatrix} h_i(k) \\ g_i(k) \\ z_i(k) \\ h_i^*(k) \\ g_i^*(k) \\ z_i^*(k) \end{bmatrix} = \begin{bmatrix} h_i(k-m) \\ g_i(k-m) \\ z_i(k-m)h_i(k-m) + z_i^*(k-m)g_i(k-m) \\ h_i^*(k-m) \\ g_i^*(k-m) \\ z_i^*(k-m)h_i^*(k-m) + z_i(k-m)g_i^*(k-m) \end{bmatrix} + u_i(k)$$

Observation equation for a node i:

$$\begin{bmatrix} v_i(k) \\ v_i^*(k) \end{bmatrix} = \begin{bmatrix} z_i(k) \\ z_i^*(k) \end{bmatrix} + n_i(k)$$

Wherein $h_i(k-m)$ is the first function indicative of the one or more properties of the electrical signal at the node i at a previous instant in time, k−m, $g_i(k-m)$ is the second function indicative of the one or more properties of the electrical signal at the node at the previous instant in time, $z_i(k-m)$ is an estimation of the one or more properties of the electrical signal at the previous instant in time, k−m, $u_i(k)$ and $n_i(k)$ are functions indicative of an error in the previous frequency estimation, and $v_i(k-m)$ is the determined property of the electrical signal at the previous instant in time, k−m, at the node, i.

17. The method according to claim 1, wherein the current function indicative of the one or more properties of the electrical signal at the node is also determined in accordance with a conjugate of the at least one determined property of the electrical signal.

18. An apparatus for estimating a frequency, the apparatus comprising:
   a processing unit arranged to perform the method of claim 1.

19. A system comprising:
   a plurality of nodes, each node comprising a processing unit arranged to perform the method of claim 1, wherein each node of the plurality of nodes is coupled to at least one other node of the plurality of nodes.

20. A non-transitory computer readable medium comprising computer readable code operable, in use, to instruct a computer to perform the method of claim 1.

* * * * *